United States Patent [19]
Quiet et al.

[11] Patent Number: 5,592,113
[45] Date of Patent: Jan. 7, 1997

[54] GRADUAL FREQUENCY CHANGING CIRCUIT

[75] Inventors: Duane G. Quiet; E. Wayne Porter, both of Portland, Me.

[73] Assignee: National Semiconductor Corp., Santa Clara, Calif.

[21] Appl. No.: 412,270

[22] Filed: Mar. 28, 1995

[51] Int. Cl.⁶ ........................................................ H03L 7/06
[52] U.S. Cl. ........................... 327/158; 327/157; 327/160; 327/245
[58] Field of Search .............................. 327/3, 5, 7, 156, 327/157, 158, 160, 245

[56] References Cited

U.S. PATENT DOCUMENTS 5,307,020 4/1994 Marcuard ........................................ 327/7
5,373,255 12/1994 Bray et al. ...................................... 327/7

*Primary Examiner*—Margaret Rose Wambach
*Attorney, Agent, or Firm*—Chris A. Caseiro; Thomas L. Bohan

[57] ABSTRACT

An error-limiting circuit for regulating the time required to bring the output signal of a control system such as a phase-locked loop device into conformance with a reference input signal. For a phase-locked loop system the error-limiting circuit is a phase-error-limiting circuit that provides for a gradual changing of the signal frequency of a voltage-controlled oscillator of the phase-locked loop device so that frequency synchronization of subsequent devices coupled to the phase-locked loop with the reference signal is ensured. The phase-error-limiting circuit forms part of the phase-frequency detector that is coupled to a charge pump that outputs current to a loop filter that in turn effectively controls the voltage-controlled oscillator. The phase-error-limiting circuit acts to assert or de-assert as required an error-correcting UP or DOWN signal to the charge pump. While the charge supplied by the charge pump is normally dependent only on the phase difference between the reference signal and the VCO signal, the phase-error-limiting circuit cuts in to control the UP or DOWN signal duration when the phase difference exceeds some pre-selected value. The phase-error-limiting circuit thereby clips the charge that can be supplied by the charge pump and thereby slows the move of the voltage-controlled oscillator frequency to the reference signal frequency.

20 Claims, 7 Drawing Sheets

GRADUAL FREQUENCY CHANGING CIRCUIT

BACKGROUND OF THE INVENTION

1. Field of the Invention

The present invention relates to a sub-circuit that regulates in a control system the phase difference used to synchronize two signals that are not in phase. In particular, the present invention relates to a sub-circuit for limiting the pulse width of a phase-difference signal used to operate a synchronizing device of the control system. More particularly, the present invention relates to a sub-circuit that provides a gradual transition in the change in frequencies developed at the output of a phase-locked loop (PLL) circuit. The sub-circuit provides a means for increasing or decreasing the transition time for changing from one operating frequency to another in order to maintain synchronization of circuitry connected to the PLL circuit when such a transition occurs. Still more particularly, the present invention is related to a phase-error-limiting circuit that is designed to modify the width of the UP and DOWN pulses transmitted to a PLL circuit charge pump so as to regulate the current available for operating a PLL circuit voltage-controlled oscillator when the phase difference between a reference signal and the output of the voltage-controlled oscillator exceeds a preselected value.

2. Description of the Prior Art

In the field of personal computers there is increasing emphasis on the need to manage the power consumed during operation. This is particularly true in the world of laptop and hand-held computers where access to standard 110-Volt AC power supplies is not essential. It is well known that a variety of methods for enhancing power consumption efficiency have been developed, including, but not limited to, increasing the efficiency or size of a DC power pack, reducing the size of the components of the device and/or placing the device in a "sleep" mode during periods of intermittent inactivity. The latter is typically achieved by reducing the clock rate of the computer. That is, if the design operating frequency of the computer is 66 MHz for example, more dynamic power is consumed if all circuitry remains at that frequency. However, if the clock rate for such a computer can be reduced to 32 MHz during inactivity, less power is consumed and the service life of the DC power pack is extended. Under this method of operation it is necessary to provide circuitry that locks the frequency of one signal to the frequency of another signal so that sub-circuitry that might otherwise be operating at different signal frequencies are synchronized. Failure to provide such synchronization can result in code execution failure, improper turning on or turning off of buses, etc. While there are countless control systems designed to provide synchronization, one type in particular is phase-locked loop (PLL) circuitry.

The basic operation of PLL circuitry can be described with reference to prior art drawing FIG. 1. In that drawing it can be seen that a simple PLL includes an Input Counter for receiving an input signal. The input signal is typically the reference signal obtained from a crystal oscillator and to which "downstream" circuitry is to be synchronized. The input signal is transmitted from the Input Counter to a phase-frequency detector (PFD) that compares the input signal to an output signal generated by a voltage-controlled oscillator (VCO) and transmitted by a Feedback Counter. The PFD transmits to a Charge Pump an UP or DOWN signal of duration comparable to the phase difference between the reference input signal and the VCO output signal. That is, the width of the pulse of the UP or DOWN signal is a function of the phase difference between the two signals. An UP signal only from the PFD operates to charge a Filter and a DOWN signal only from the PFD operates to discharge the Filter. When both UP and DOWN signals are set, the Charge Pump provides no current to the Filter. The Filter conducts the alternating current (AC) component of the PFD signal away from the VCO, leaving only the direct current (DC) component transmitted to the VCO. The magnitude of the DC signal transmitted to the VCO is ordinarily a function of the phase difference between the original input signal and the VCO output signal to the PFD. That is, as the phase difference increases, the change in average current supplied to the Filter increases. As is well known, a change in the magnitude of the DC signal to the VCO operates to change the frequency of the VCO output signal until the output signal and the input signal are of essentially the same frequency. In many PLL systems, as the phase difference between the two signals increases, the voltage applied to the VCO increases proportionally such that large phase differences may induce more quickly the change in the frequency of the VCO signal.

While the present discussion is directed to PLL circuitry, it is to be understood that many other control systems may operate in a similar fashion. That is, many such control systems operate on the general principle of comparing a reference signal and a feedback signal, generating an error signal based on the difference in the two compared signals, and modifying an output signal based upon that error signal. In the case of a PLL, that error signal is related to phase. In other control systems, that error signal may be voltage related, current related, position related, etc. Regardless of the specific type of error signal, it is the comparison of the input reference signal and the feedback signal, which may be the output signal, or at least determined by the output signal, that is used to effect a change in the control system in order to bring the output signal in line, or "locked" on to the input reference signal.

The switching times of devices used in present systems, such as the laptop computers that are presently available, are much faster than those used only a few years ago, and the trend is for ever faster and smaller systems. The PLL devices available to provide the synchronization necessary in such systems are correspondingly smaller and faster. Unfortunately, the small complex systems that are and that will soon be available include many components, not all of which operate at the same speed. This is particularly the case where it is desirable to conserve energy when the system is not in use and yet certain components must be kept operating. For example, in a computer system designed to operate in the range 50–66 MHz, some components, such as timing clocks, can be maintained at much lower rates, on the order of 32 MHz and less, when the computer is not in use, so as to conserve power. However, problems in synchronization can occur when the PLL is designed to meet the synchronization needs for output frequencies in the higher range. That is, the PLL may too quickly convert from a higher to a lower frequency before downstream components are prepared to accept the altered input. In one example, a downstream component that requires a delay on the order of milliseconds before receiving the changed input frequency may be coupled to a PLL that switches from one frequency to another within a few microseconds. The timing difference may well cause a loss of lock in devices with PLL-based timing elements, including, but not limited to, CPUs and keyboard controllers.

One method for delaying the switched output of the PLL shown in FIG. 1 would be to modify the prior Filter so as to slow the signal transmitted to the VCO. That may be done by increasing the capacitance of the Filter, either with an internal capacitor (one that is "on-chip"), or with an external capacitor (a discrete "off-chip" device). To get the timing delay previously indicated, the capacitance would have to be much greater than that used for most of the present PLL circuits needed to switch in the high frequency range. That is, one or more capacitors valued in the microfarad range would be needed, rather than the picofarad capacitors ordinarily used. In the field of monolithic integrated circuits, where space on a chip is extremely limited, the addition of one or more very large microfarad-sized internal capacitors would severely restrict a circuit designer's options with regard to other components. It would also increase the cost of the chip. Since the ongoing goal is to make more efficient devices, the addition of more and larger elements, can be viewed as a step backward and therefore undesirable. Similarly, if an external capacitor were used, there would be a resultant reduction in available board space and an increase in board cost.

In all of this discussion regarding the timing problems that are not completely addressed by the PLL circuitry presently available, the primary characteristics of the PLL must be kept in sight when looking for a solution. In particular, the specified gain and operating bandwidth of the PLL must be maintained. The operating bandwidth selected and to be maintained by the PLL is dependent upon the need to avoid the effects of jitter caused by noise external to the circuit. A PLL that operates within the band of interest as expected and with the gain desired, and that provides the type of transition delay noted would be particularly useful. Similarly, this would be useful for other types of control systems, including clock recovery circuits, floppy disk controllers, or any system that incorporates the comparison of a reference signal and a particular output signal that is fed back to a phase-difference-determining component.

Therefore, what is needed is a means for regulating or otherwise modifying a phase difference signal in a control system so as to regulate the rate at which synchronization of at least two signals is achieved. In particular, what is needed is a PLL device that provides for synchronization of two signals initially unequal in frequency in a predetermined bandwidth and that also slows the transition from one frequency to another within the predetermined bandwidth. What is also needed is a PLL device as noted that does not interfere with the standard operation of the system and that does not increase or otherwise affect the jitter associated with the system. Still further, what is needed is a PLL device as noted that may be fabricated as part of a monolithic circuit with minimal increase in the space required.

SUMMARY OF THE INVENTION

It is an object of the present invention to provide means for regulating the difference signal used to synchronize two signals of unequal characteristics in a control system. It is also an object of the present invention to provide phase-locked loop circuitry that synchronizes two signals of unequal frequency within a controlled period of time that may be much slower than available in present related PLL systems. Further, it is an object of the present invention to provide such circuitry so that the frequency change occurs gradually and with little, if any, affect on the jitter associated with the operating system of which it forms a part. Still further, it is an object of the present invention to provide PLL circuitry that can be fabricated as part of a monolithic circuit with minimal encroachment on the space typically available in semiconductor devices.

These and other objects are achieved in the present invention through the addition of an error-limiting stage forming part of an error-comparison component of a control system. The error-limiting stage is designed to receive an error signal and then to modify that signal in a way to regulate the rate at which the output signal of the control system lines up with, or locks to, the input reference signal. Prior devices utilize the difference between the input signal and a feedback signal to provide a change in the output signal that is a function of the magnitude of the error, or difference signal. The present invention is distinct in that it provides a means for fixing, or clipping, the rate of change of the output signal, independent of the magnitude of the difference signal. That difference signal may be phase related, as in a PLL, or it may be voltage-related, current-related, position-related, etc.

In a PLL system, that error-limiting stage is preferably a phase-error-limiting (PEL) stage that may be used in conjunction with the phase-frequency detector (PFD) of a PLL. The PEL stage is preferably selectable such that the user may initiate the synchronization sequence as quickly as possible using standard PFD arrangements or, gradually, within a predetermined transition window that may be orders of magnitude slower than when the standard PFD arrangement is in use. The PEL stage effectively clips the charge applied to the loop filter via the charge pump such that the controlling voltage change applied to the VCO by the loop filter is limited when the phase difference magnitude exceeds some predetermined value. This is achieved through the addition of PEL bypass circuitry that modifies the pulse supplied by the PFD to the charge pump. The modification effectively regulates the saturation rate of the charge pump so as to increase the number of loop cycles required to produce synchronization. The result of this effect can be observed at line 102 in FIG. 9, to be described herein.

The present invention is designed such that at small phase differences at the input of the PFD, the PLL will operate essentially in the same way that prior similar systems do. That is, for small phase differences, the standard PFD operation controls wherein the width of the UP or DOWN pulse is regulated by the phase difference between the two signals. At larger phase differences, the PEL stage of the present invention takes over control of the width of the UP or DOWN pulse such that the current supplied by the charge pump reaches a saturation level that is independent of the phase difference between the two signals of importance. That is, there is a fixed change in voltage on the loop filter, rather than a change in voltage that varies with phase difference between the reference signal and the VCO output signal. The resultant change in voltage on the loop filter operates to slow the rate of change of the VCO frequency. In that way, the VCO moves toward a new frequency at a saturation value rather than at a rate solely dependent upon phase difference, one which can be extremely high.

For prior PLL's, the frequency changing rate of the VCO increased with increasing phase differences at the PFD. As a result, large differences in phase at the PFD caused the fastest changes in VCO frequency output, as indicated at line 101 in FIG. 9. The fixed rate of change provided by the present invention means a slowdown in reaching the ultimate matching frequency to be achieved than would otherwise occur if the charge pump were permitted to supply all current, and therefore all charge, available. Specific arrangement and design of components of the PEL stage, as well as the design of the other sub-systems of the particular control system, will determine how much phase difference is required before the PEL stage will regulate the phase difference signal to the charge pump. As the "delay" provided by the PEL stage increases, the time to synchronous lock decreases. Likewise, a shorter delay increases the lock time.

The PEL stage of the present invention essentially operates to adjust the time that a signal associated with the PFD used to control the charge pump is asserted. The standard operation of the prior PLL disclosed involves the assertion of an UP signal when the charge pump is to be turned "on." The UP signal remains asserted and the pump remains on and supplies current to the capacitive loop filter, which charges the VCO as previously noted. The length of the UP pulse; that is, the length of time that it is asserted, is dependent upon the phase difference between the reference crystal signal and that of the VCO output signal. The longer an UP signal remains asserted, the longer the width of the pulse to the charge pump. That results in an increase in the average current supplied by the pump, $I_d$, as indicated by Eq. 1 below.

$$I_d = I_p(\Delta\phi/2\pi) \quad \text{(Eq. 1)}$$

where $I_p$ is the amplitude of the charge pump current and the phase difference, $\Delta\phi$, is dependent upon the difference in the two signals and ordinarily controls the width of the UP or DOWN pulse. The charge pump may, but does not have to be, shut down only when the UP signal is de-asserted by the assertion of a DOWN signal to the charge pump. This particular example is for when the reference signal leads the VCO signal. The same can be said for assertion of a DOWN signal when the reference signal lags the VCO signal.

As previously noted, the PEL stage of the present invention forms a part of the PFD and acts as a switch for regulating the length of time that a particular signal, whether UP or DOWN, is asserted. That is achieved by periodically de-asserting the controlling UP or DOWN signal until such time as the VCO signal fed back to the PFD in effective "catches up" with the reference signal and final de-assertion occurs. While any type of delay mechanism can be used to form the PEL stage, such as the addition of resistance-capacitance elements, the PEL stage of the PFD of the present invention preferably includes a plurality of inverters in series. The number and size of the inverters can be selected as a function of the delay desired. This delay determines the pulse width of the asserted signal to the charge pump when the phase difference exceeds some selected value. The PEL stage delay becomes the phase difference indicated in Eq. 1, superseding and reducing the pulse width of the UP or DOWN signal that would otherwise be controlled by the phase difference just between the two signals alone. In order to increase by several orders of magnitude the delay time associated with a synchronization occurring in the frequency range 30–70 MHz, for example, a minimum of eight inverters of the type to be described herein may be required, each inverter including a complementary pair of MOS transistors. The PEL stage is coupled to the standard circuitry of the PFD such that it may be utilized when desired.

These novel features and others will become apparent upon review of the detailed description of the preferred embodiment and the appended claims.

DETAILED DESCRIPTION OF THE PREFERRED EMBODIMENT OF THE PRESENT INVENTION

Figure 1:
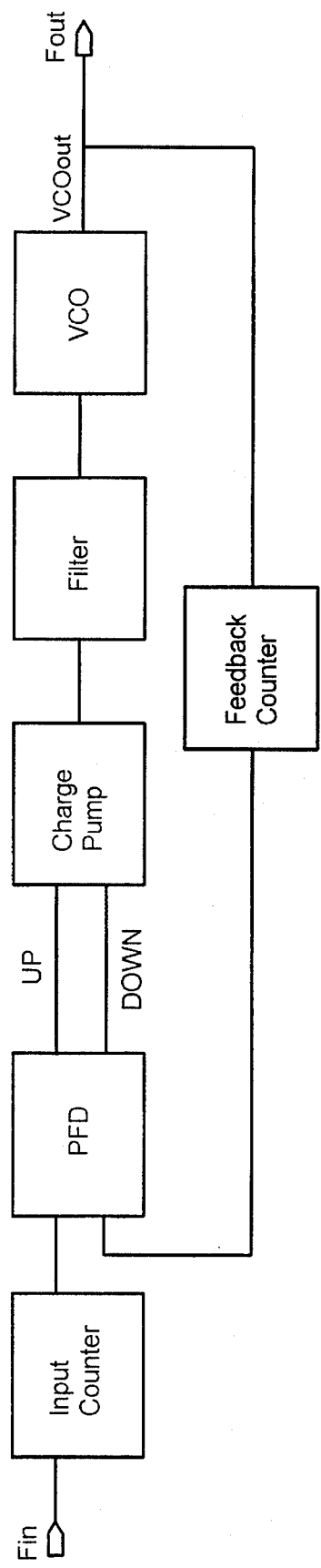
FIG. 1 is a simplified block diagram of a prior PLL system (prior art).
Figure 2:
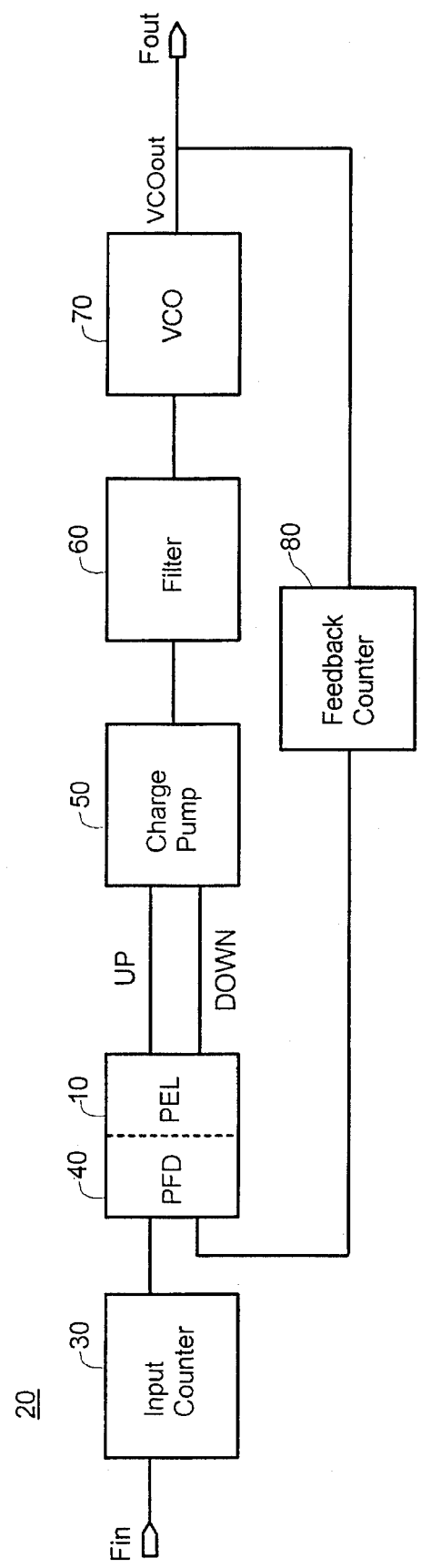
FIG. 2 is a simplified block diagram of the PLL system of the present invention.

As illustrated in FIG. 2, the device of the present invention includes a selectable phase-error-limiter (PEL) stage 10 that forms part of a phased-lock loop (PLL) system 20 having an input counter 30, a phase frequency detector (PFD) 40, a charge pump 50, a loop filter 60, a voltage-controlled oscillator (VCO) 70, and a feedback counter 80. The PEL stage 10 is a specific component of the PFD 40 and regulates both an UP signal and a DOWN signal transmitted by the PFD 40 to the charge pump 50. While the particular PLL system 20 shown in FIG. 2 will be used to describe specific preferred features of the present invention, it is to be understood that the PEL stage 10 is designed to modify the phase-difference signal of any control system. With regard to the PLL system 20 shown, it is to be understood that the non-PFD components, such as the counters 30 and 80, as well as the charge pump 50, the loop filter 60, and the VCO 70 may be of any type available and designed to function as typically expected.

Figure 3:
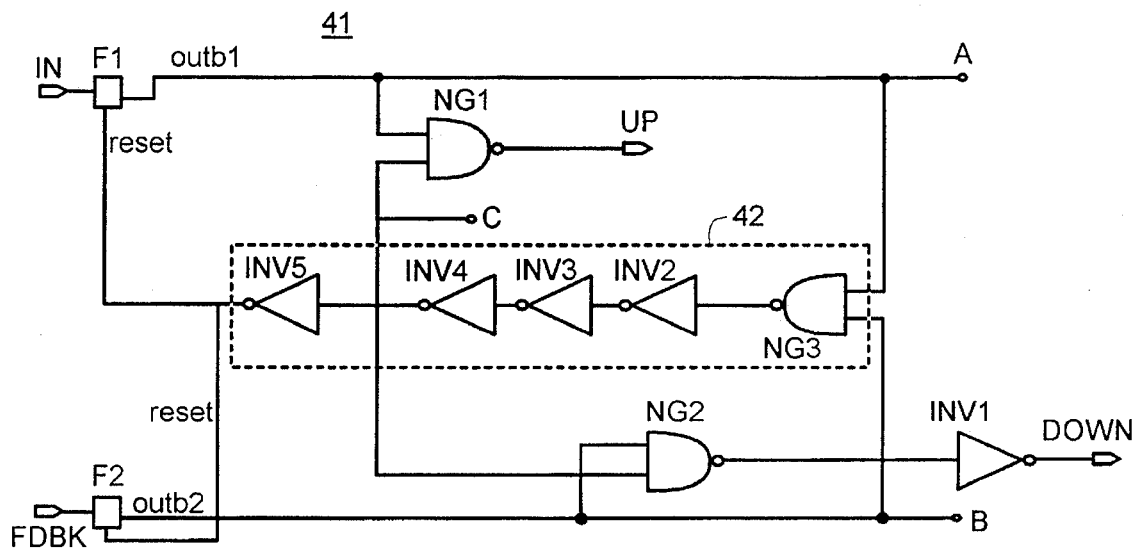
FIG. 3 is a simplified schematic diagram of a standard portion of the PFD of the PLL system of the present invention.

The PEL stage 10 of the present invention is selectable in that it may be coupled to, or decoupled from, standard PFD section 41 of the PFD 40, as illustrated in FIG. 3. The standard PFD section 41 includes a reference signal input IN connected to flip-flop F1. The reference signal input IN is preferably obtained from a crystal reference, or from the output of the input counter 30, as is well known in the art. The reference input IN is connected to flip-flop F1 such that the output signal outb1 of flip-flop F1 is asserted high when a rising edge is detected on the reference input IN. The standard PFD section 41 also includes a feedback signal input FDBK connected to flip-flop F2. The feedback input FDBK is the output of the feedback counter 80, but could also come from the output of the VCO 70, identified as signal $VCO_{out}$. The feedback input FDBK is connected to flip-flop F2 such that the output signal outb2 of flip-flop F2 is asserted high when a rising edge is detected on the feedback input FDBK. In the prior PFD discussed, it is only the difference in the rising edges of signals IN and FDBK that determines the phase difference used to assert either an UP or a DOWN signal to a typical charge pump, the charge pump 50. Other charge pump arrangements may be used with the PEL stage 10 of the present invention without deviating from the basic advantageous function of that device. Both flip-flop F1 and flip-flop F2 are standard D flip-flops well known in the field of the present invention, wherein an output and its complement are determined by the correspondence between a "set" input signal and a "reset" input signal. However, it is to be understood that variants on flip-flops F1 and F2 could also be used, depending on the particular design of the phase-locked loop circuit, without deviating from the basic operation of the present invention.

With continuing reference to FIG. 3, the standard PFD section 41 includes NAND gate NG1 with one input being the complementary signal outb1 and the other input being connectable either to a high-potential power rail, identified generally as $V_{cc}$ which is at any potential higher than a low-potential rail identified generally as GND, or to the PEL stage 10 to be described herein. The output of NAND gate NG1 is the UP signal UP transmitted to the charge pump 50. The standard PFD section 41 also includes NAND gate NG2 with one input being the complementary signal outb2 and the other being connectable either to $V_{cc}$, or to the PEL stage 10. DOWN inverter INV1 inverts whatever signal is transmitted by NAND gate NG2 so as to produce the DOWN signal DOWN transmitted to the charge pump 50. Of course, it is to be understood that the DOWN signal may be passed directly from NG2 to the charge pump 50 without inversion, depending upon the design of the charge pump 50. Similarly, the UP signal may be inverted prior to transmittal to the charge pump 50 at the option of the designer and without effect on the basic principles of operation of the PEL stage 10 of the present invention. The standard PFD section 41 includes flip-flop reset stage 42 having NAND gate NG3 with inputs outb1 and outb2, and inverters INV2, INV3, INV4, and INV5. The output of inverter INV5 is coupled to the reset node of flip-flop F1 and to the reset node of flip-flop F2.

When the standard PFD section 41 is used without the PEL stage 10, the PFD 40 operates as follows when IN leads FDBK. First, the outputs of flip-flops F1 and F2 are set to an initial value, either high or low, depending upon the specifics of the downstream components. For the circuit shown in FIG. 3, output signals outb1 and outb2 are initially set to be low. This makes UP high and DOWN low. For the charge pump 50 illustrated in FIG. 5, this results in no current at charge pump output $CP_{out}$ to be supplied by the charge pump 50 to the loop filter 60. As previously indicated, under these conditions, there is no change in the VCO output $VCO_{out}$, indicating that the reference input IN and the feedback input FDBK are in synchronous phase. When input IN changes so as to produce a rising edge for F1, outb1 goes high and UP therefore goes low. For the charge pump 50 of FIG. 5, the result is a positive current that charges the loop filter 60 and thereby supplies positive voltage change to the VCO 70, which ripples through the feedback counter 80 and flip-flop F2 to change outb2 from low to high. Until outb2 changes from low to high, UP remains asserted; that is, it remains low such that current is supplied by the charge pump 50. When outb2 does change from low to high, reset stage 42 resets flip-flops F1 and F2 so that UP goes high, DOWN stays low, and charge pump 50 ceases to supply current. The time that it takes for outb2 to be converted from low to high is a function of the phase difference between reference input IN and feedback input FDBK. The greater that difference, the longer UP is asserted and more charge is supplied to the loop filter 60. For the standard PFD section 41 shown, the rate at which FDBK moves toward the reference input IN increases as the current supplied by the charge pump 50 increases. Therefore, as previously indicated, large phase differences yield rapid changes in FDBK. It is this rate of change that the PEL stage 10 modifies.

Figure 4:
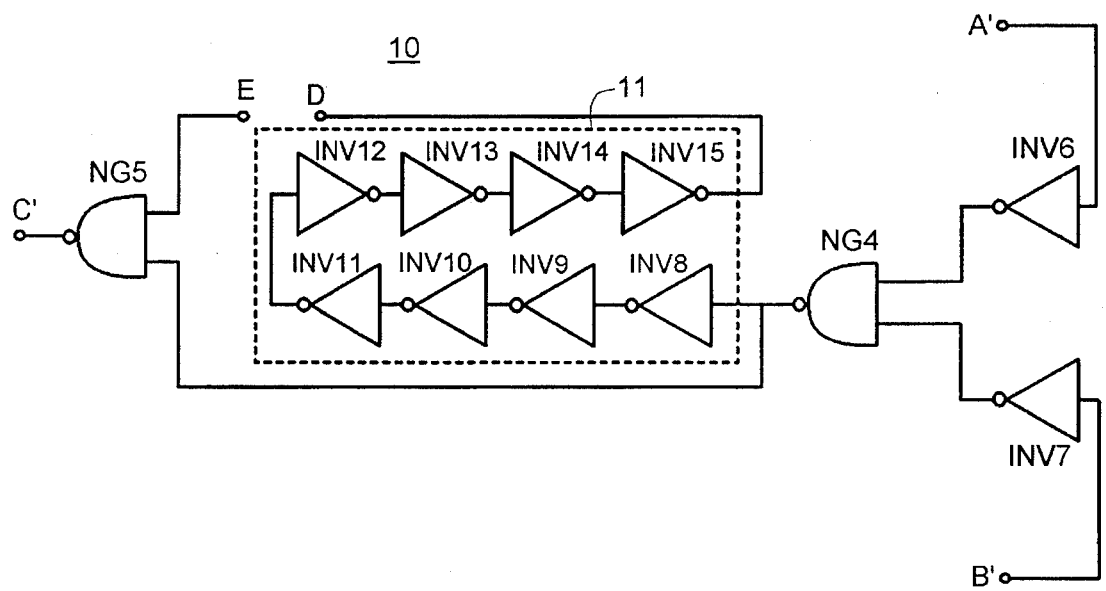
FIG. 4 is a simplified schematic diagram of the PEL stage of the present invention, showing a plurality of inverters coupled to two NAND gates.

The PEL stage 10 illustrated in FIG. 4 modifies the rate of change of FDBK by effectively short-circuiting the operation of the standard PFD section 41. In the preferred embodiment of the invention, the PEL stage 10 is optionally coupled to the standard PFD section 41 in the following way: node A of PFD section 41 is connected to node A' of PEL stage 10; node B of PFD section 41 is connected to node B' of PEL stage 10; and node C of PFD section 41 is connected to node C' of PEL stage 10. Inverter INV6 is coupled directly to outb1 and along with inverter INV7, which is coupled directly to outb2, provides an input to NAND gate NG4. The output of NG4 is transmitted through a primary current-limiting inverter stage 11 that provides an input to NAND gate NG5. The PEL stage 10 illustrated in FIG. 4 includes nodes D and E. These nodes may either be coupled directly together, or they may alternatively be used to insert supplemental delay components, such as additional inverter stages, to be described herein. While the PEL stage 10 shown in FIG. 4 indicates that the primary inverter stage 11 is formed of eight inverters INV8–INV15, it is to be understood that any number of such inverters may be used, depending upon the components forming those inverters and the modification in the rate of change of FDBK desired. The other input to NG5 is the output of NG4. The output signal from NG5 is connected via node C'-C as an input to both NAND gates NG1 and NG2 of the PFD section 41.

In operation, the PEL stage 10 coupled to the standard PFD section 41 acts as a diverter in changing UP (or DOWN when FDBK leads rather than lags IN) when the phase difference between the two signals exceeds some value. Prior to reaching that phase difference value however, the operation of the standard PFD section 41 controls as described. Under the specific initial conditions indicated in the discussion of the standard PFD section 41, when outb1 changes from low to high as a result of a rising edge at IN, the signal at node A'-A, also changes from low to high. The signal propagates through inverter INV6, NAND gate NG4, primary inverter stage 11, and NAND gate NG5 to node C'-C. Thus, with outb1 switched to high, and outb2 remaining low (at least until a rising edge on FDBK changes that condition) the input to NAND gate NG1 via node C is no longer high, as it was when connected directly to high-potential power rail $V_{cc}$, but is instead switched to low. As a result, the UP signal is "prematurely" changed to high and the current supplied by the charge pump 50 to the loop filter 60 is cut off. However, that condition does not remain in effect since outb2 remains low and the reset stage 42 of the standard PFD section 41 thereby continues to remain high, resulting in no resetting of the flip-flops F1 and F2. Since there is yet no reset, outb1 remains in this state until a rising edge on FDBK causes the PFD 40 to be reset. The PFD 40 is then ready for a rising edge on either IN or FDBK, and a corresponding subsequent rising edge on either FDBK or IN. The PEL stage 10 repeats its operation as noted so as to switch the UP signal from low to high. The process is repeated until FDBK finally triggers a change in outb2 such that the resetting of flip-flops F1 and F2 finally force UP high. It is to be understood that the PEL stage 10 may be seen to operate in a symmetric way when FDBK leads IN and the DOWN portion of the device contains the controlling rising edge. Therefore, the prior discussion about the operation of the PEL stage 10 similarly holds in that situation.

Figure 6:
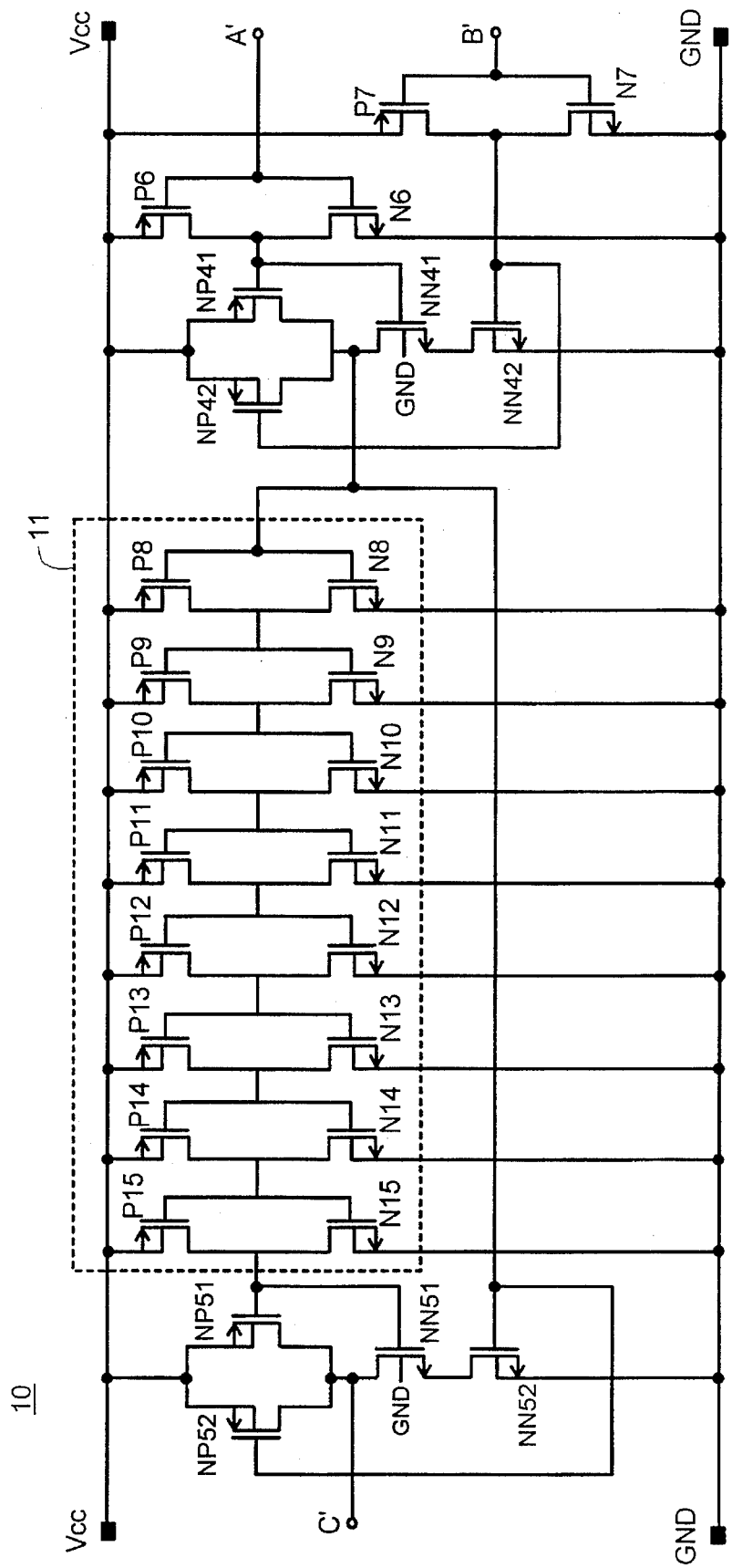
FIG. 6 is a simplified schematic diagram showing the PEL stage of the present invention as a plurality of CMOS transistor pairs.

The PEL stage 10 may be designed in a variety of logic configurations in order to achieve the goal of regulating the rate of change of the FDBK signal, as would be understood by those skilled in the art. It is contemplated that any suitable arrangement of AND, NAND, OR, and/or NOR gates, with or without one or more inverters, may be used for this purpose. It has been observed that the design shown in FIG. 6, wherein the simplified components of FIG. 4 are more fully illustrated, will achieve the noted goal. Major components are illustrated while supplemental elements, such as resistances that may or may not be desired, are excluded. In FIG. 6 it can be seen that the PEL stage 10 includes combinations of PMOS and NMOS transistors coupled together, and to the high-potential rail $V_{cc}$ and to the low-potential rail GND. Specifically, INV6 is preferably formed of the CMOS combination of PMOS transistor P6 and NMOS transistor N6, and INV7 is preferably formed of the CMOS combination of PMOS transistor P7 and NMOS transistor N7. The input to the gates of P6 and N6 is outb1, indicated by node A' in FIG. 6. The output of INV6 is connected as one of the two inputs to NAND gate NG4, which in the preferred embodiment of the invention includes PMOS transistors NP41 and NP42 and NMOS transistors NN41 and NN42, coupled as shown. The other input to NG4 is the output of INV7, which has outb2 as the input to the gates of transistors P7 and N7, indicated as node B'. The design of NAND gate NG5 is similar to that of NAND gate NG4, in that it includes two sets of MOS transistors, one set being P-type and the other N-type. In particular, NG5 includes PMOS transistors NP51 and NP52, and NMOS transistors NN51 and NN52 connected as shown. One input to NG5 is the output of the primary inverter stage 11 and the other input to NG5 is the output of NAND gate NG4. As earlier noted, the output of NG5 is coupled to NAND gate NG1 via node C'.

While the devices illustrated in the accompanying drawings and described herein are shown to be MOS transistors, it is to be understood that the pulse limiting provided by the particular PEL stage 10 shown may be achieved using other components, including bipolar transistors, combinations of bipolar and MOS transistors, and other resistance-capacitance combinations. For the PLL arrangement shown in FIG. 2, and with the charge pump 50 shown in FIG. 5, the preferred embodiment of the present invention includes PMOS transistors and NMOS transistors that may have size ratios on the order of about 1:1 to about 2.5:1, PMOS to NMOS size. However, as noted, any of a variety of combinations may be used to produce pulse-width-limiting characteristics of the PEL stage 10 as desired.

The primary inverter stage 11 of the present invention is preferably formed of a set of eight inverters as previously indicated and shown in FIG. 6. However, as noted, other gate arrangements may be used with similar logic results. Each of the inverter stages of the primary inverter stage 11 includes a CMOS transistor pair having one PMOS transistor and one NMOS transistor operating in a manner well known to those skilled in the art. Each of the PMOS transistors of the primary inverter stage 11, designated transistors P8–P15, has a source node and a substrate coupled to $V_{cc}$ and a drain node coupled to a drain node of corresponding NMOS transistors N8–N15. A source node and a substrate of each of the NMOS transistors N8–N15 is coupled to GND. The gates of corresponding pairs of PMOS and NMOS transistors are the input to that particular inverter, wherein the input to that particular inverter is the output of a previous inverter. For example, the gates of transistors P9 and N9 are coupled to the output of inverter INV8, and the coupled drain nodes of transistors P9 and N9 is the input to inverter INV10. The input to the transistor pair of inverter INV8 is the output of NAND gate NG4 and the output of the transistor pair of inverter INV15 is one of the inputs to NAND gate NG5. It is to be understood that more or fewer inverters may be used to form the primary inverter stage 11. In particular, if more delay in the switching off of the UP signal is desired, additional delay components may be inserted into the PEL stage 10. Such a delay component or components may be connected at node D-E.

Figure 7:
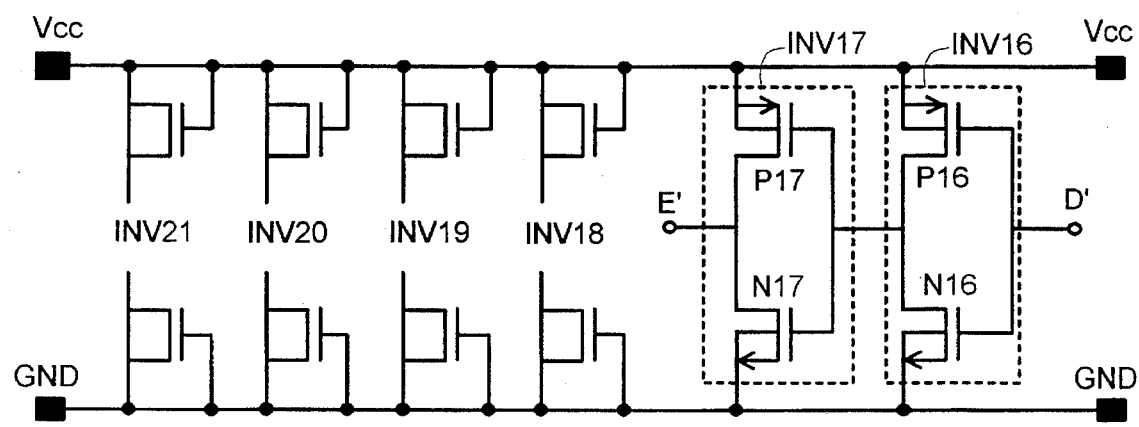
FIG. 7 is a simplified schematic diagram of an alternative sub-circuit connectable to the PEL circuitry of FIG. 6, showing a plurality of CMOS inverter pairs.

In an alternative embodiment of the present invention, supplemental delay components may be inserted between the output of INV15 and one of the inputs to NG5. Such components include, but are not limited to, inverters, resistances and capacitances, and the like. These supplemental devices are preferably designed to slow the propagation delay through the PEL stage 10, thereby effectively increasing the maximum phase difference where clipping of the change in voltage to the loop filter 60 occurs. Such supplemental devices may be particularly useful as means for compensating for variations in other components of the PLL system 20, including, but not limited to, the VCO 70. One example of such a supplemental delay sub-circuit is shown in FIG. 7 includes inverter INV16 having transistors P16 and N16 with the input to their gates coupled to the output of inverter INV15 at node D'. The output of INV16 is the input to the gates of transistors P17 and N17 of inverter INV17. When coupled to the primary inverter stage 11 in this way, the output of INV17 becomes one of the inputs to NG5 at node E'. The supplemental delay circuit of FIG. 7 may also include additional inverter pairs INV18–INV21 to regulate the delay provided by the circuit that may be selected as desired for particular operational characteristics.

Figure 5:
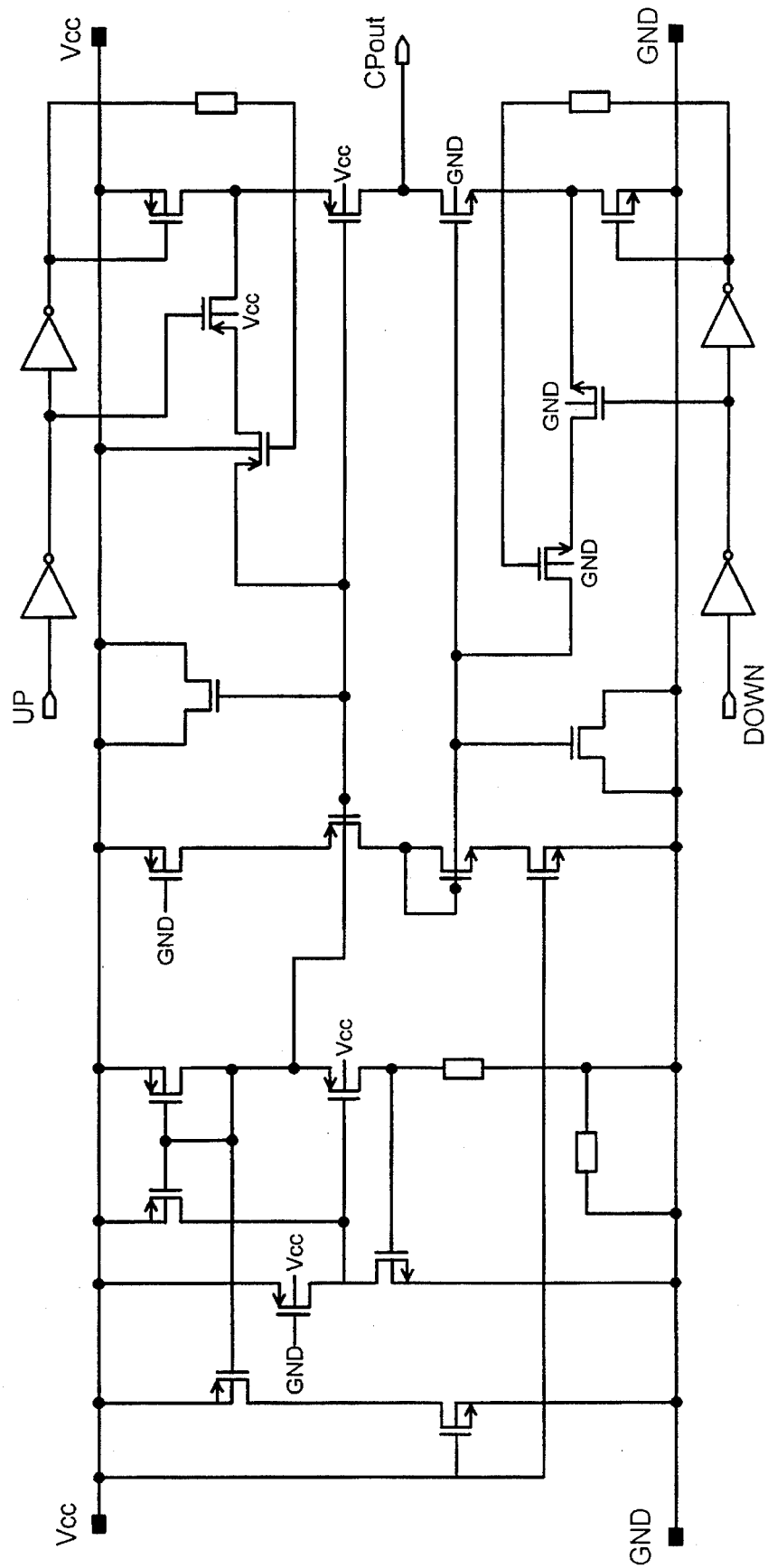
FIG. 5 is a simplified schematic diagram of charge pump circuitry couplable to the PFD of the present invention.
Figure 8A:
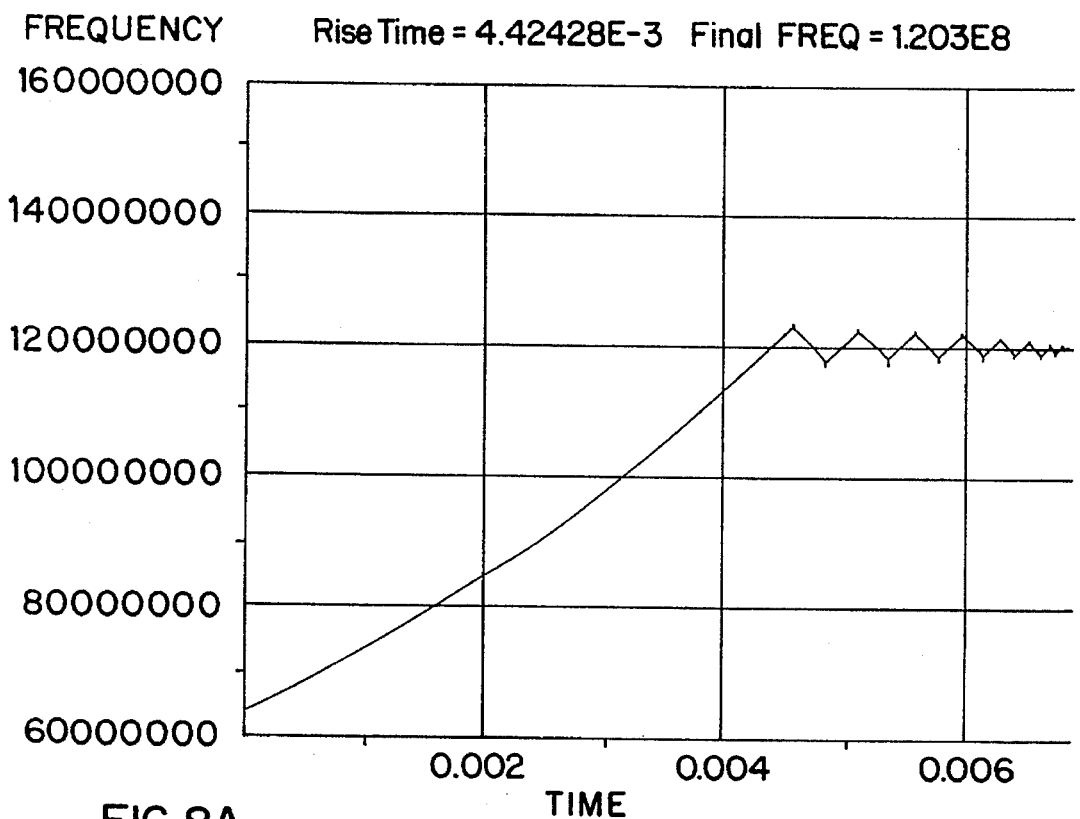
FIG. 8A is a graph of the time for the PLL circuit frequency to shift to that of the reference signal frequency for the PLL of the present invention having the PEL stage shown in FIG. 6.
Figure 8B:
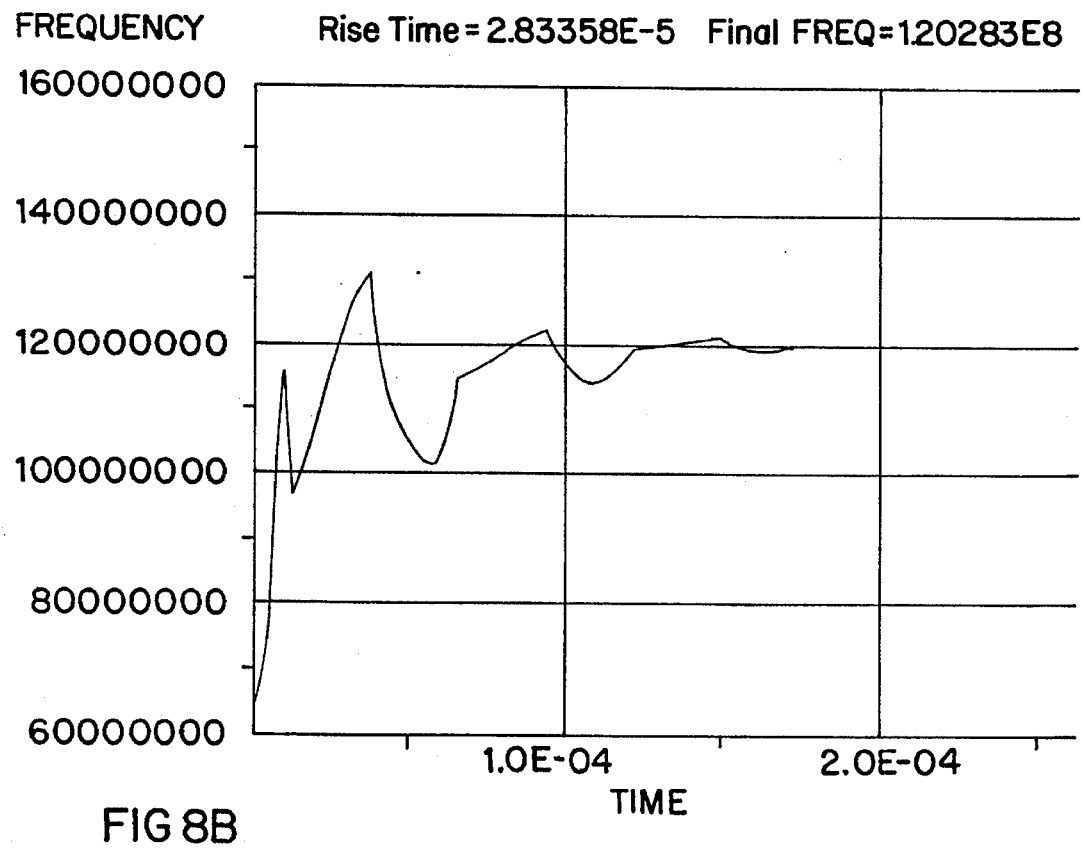
FIG. 8B is a graph of the time for the PLL circuit frequency to shift to that of the reference signal frequency for a PLL with a prior-art PFD arrangement.

As a comparison of the delay provided in synchronizing FDBK and IN, FIGS. 8A and 8B illustrate the time for the $VCO_{out}$ frequency to change from about 66 MHz to about 120 MHz for a PLL device of the type shown in FIG. 2 with the charge pump 50 of FIG. 5. FIG. 8B shows the time to make the frequency change with the standard PFD section 41 only, and FIG. 8A shows the time to make the same frequency change for the PFD of the present invention, including the PEL stage 10 shown in FIG. 6 coupled to the supplemental circuitry shown in FIG. 7. It can be seen from FIGS. 8A and 8B that the time to reach the reference frequency is more than two orders of magnitude longer for the PEL-stage coupled PFD than for the standard PFD. In that way, the present invention permits the switch in frequency to occur slowly enough to enable downstream devices to accept the switch, but without such a long delay that other synchronization problems occur.

Figure 9:
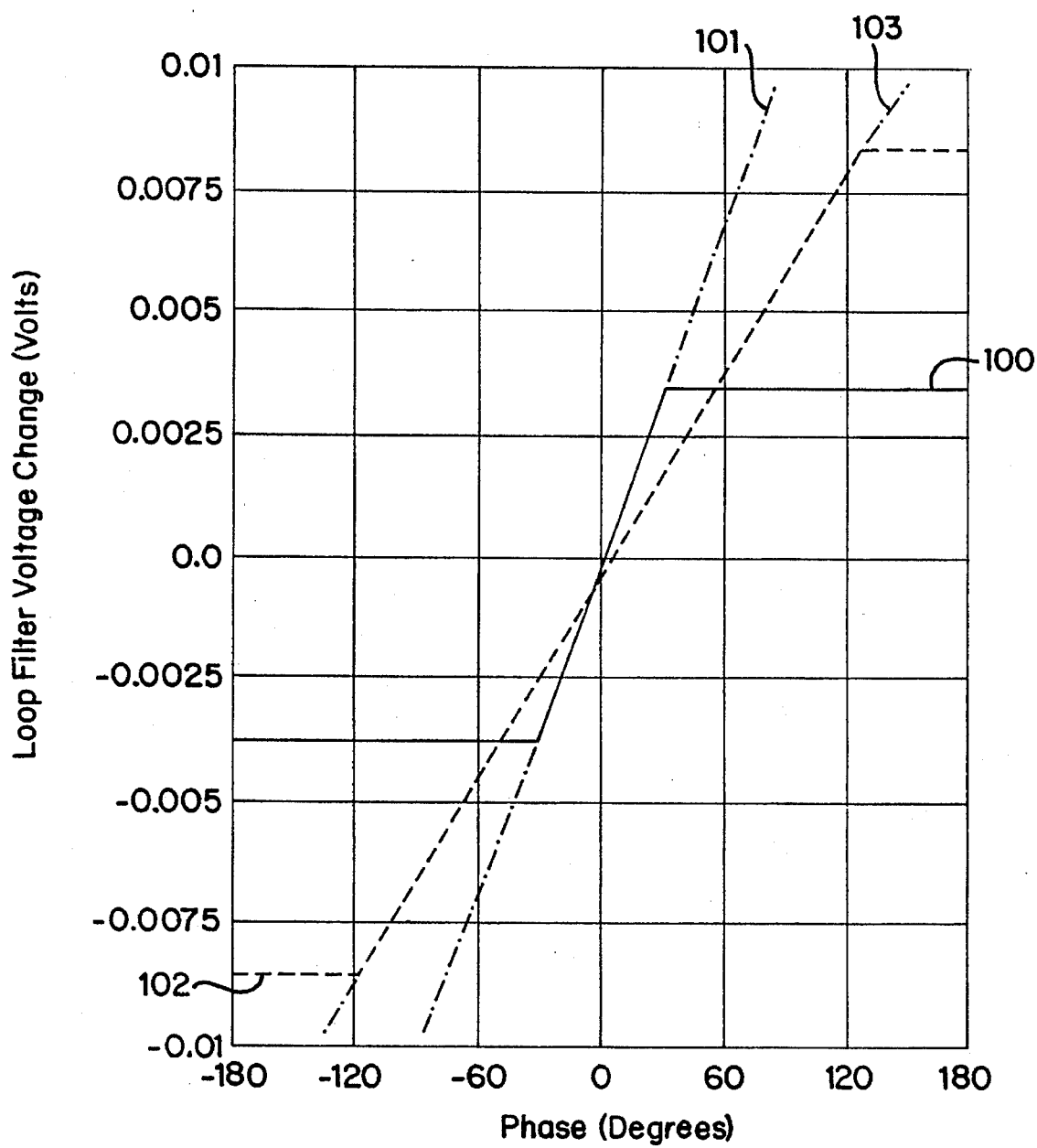
FIG. 9 is a graph showing a comparison of transfer functions versus phase difference for a PLL with the PEL stage of the present invention and a PLL without the PEL stage of the present invention.

FIG. 9 further illustrates the delay advantage provided by the PEL stage 10 of the present invention. Solid line 100 illustrates the effect of the ten-inverter PEL stage 10 of FIGS. 6 and 7 under operating conditions of –40° C. and a high-potential power rail at about 5.5 V. It is to be noted that FIG. 9 shows the transfer function of the change in voltage of the output of the loop filter 60 due to phase difference. For the device of the present invention under the conditions noted, line 100 indicates that the PLL 20 operates as if the PEL stage 10 were not present for phase differences between FDBK and IN up to about ±20°. For phase differences greater than that, the PEL stage 10 takes over and limits the charge supplied to the loop filter 60 by the charge pump 50 so that the voltage change to the VCO 70 is fixed over the remaining phase difference range. That is, the pulse width provided by the PFD UP or DOWN signal is controlled and fixed by the PEL stage 10 regardless of the phase difference between FDBK and IN. Dashed line 101 indicates what the transfer function for the PLL 20 would be under the same operating conditions if the ten-inverter PEL stage 10 were omitted. Under those operating conditions, the PEL stage 10 formed of the components illustrated in FIGS. 6 and 7, provides for the PLL 20 a fixed pulse width on the order of about 10–15 nanoseconds when clipping occurs.

Dotted line 102 illustrates the effect of the ten-inverter PEL stage 10 under operating conditions of ±125° C. and the high-potential power rail at only 4.5 V. In that situation, the PLL system 20 does not provide clipping until the magnitude of the phase difference between FDBK and IN is about 60°. Dashed line 103 indicates what the transfer function would otherwise be for the PLL 20 under those operating conditions if the PEL stage 10 were omitted. Under those operating conditions and when the PEL stage 10 of FIGS. 6 and 7 is used, the pulse width provided is about 40 nanoseconds when clipping occurs. As can be seen, and as would be expected, operating conditions including, but not limited to, temperature, source values, and the designs of the other non-PFD devices will necessarily affect the performance of the device of the present invention.

Although the preferred embodiment of the present invention has been described herein, the above description is merely illustrative. Further modification of the invention herein disclosed will occur to those skilled in the respective arts and all such modifications are deemed to be within the scope of the invention as defined by the appended claims.

What is claimed is:

1. A phase-locked loop device comprising:
   a. a phase-frequency detector for receiving a reference signal and a VCO signal to be compared to said reference signal;
   b. a charge pump coupled to said phase-frequency detector, for converting a digital UP signal or a digital DOWN signal from said phase-frequency detector into a current;
   c. a loop filter coupled to said charge pump, for receiving a charge related to said current from said charge pump; and
   d. a voltage-controlled oscillator coupled to said loop filter and to said phase-frequency detector, wherein a voltage at an output of said loop filter controls a frequency of said VCO signal transmitted by said voltage-controlled oscillator to said phase-frequency detector, wherein said phase-frequency detector includes means for regulating a phase difference associated with said digital UP signal or said digital DOWN signal transmitted by said phase-frequency detector.

2. The phase-locked loop device as claimed in claim 1 wherein said means for regulating said phase difference is a means for limiting a pulse width of said digital UP signal or said digital DOWN signal transmitted by said phase-frequency detector.

3. The phase-locked loop device as claimed in claim 2 wherein said phase-frequency detector includes an UP signal input node and a DOWN signal input node, wherein said means for limiting a pulse width of said digital UP signal or said digital DOWN signal is a phase-error-limiting stage having an output coupled to said UP signal input node and to said DOWN signal input node.

4. The phase-locked loop device as claimed in claim 3 wherein said phase-frequency detector includes means for receiving said reference signal and means for receiving said VCO signal, said phase-error-limiting stage further comprising a first limiting input node coupled to said means for receiving said reference signal and a second limiting node coupled to said means for receiving said VCO signal.

5. The phase-locked loop device as claimed in claim 4 wherein said means for receiving said reference signal is a first flip-flop and said means for receiving said VCO signal is a second flip-flop, and wherein said first input of said phase-error-limiting stage is coupled to an output of said first flip-flop and said second input of said phase-error-limiting stage is coupled to an output of said second flip-flop.

6. The phase-locked loop device as claimed in claim 5 wherein said phase-error-limiting stage includes one or more inverters and one or more NAND gates.

7. The phase-locked loop device as claimed in claim 6 wherein said phase-error-limiting stage includes:
   a. a first inverter having as an input said first input of said phase-error-limiting stage;
   b. a second inverter having as an input said second input of said phase-error-limiting stage;
   c. a first NAND gate having an output of said first inverter as a first input and an output of said second inverter as a second input;
   d. a primary inverter stage having an output of said first NAND gate as an input; and
   e. a second NAND gate having said output of said first NAND gate as a first input and an output of said primary inverter stage as a second input, wherein an output of said second NAND gate is said output of said phase-error-limiting stage.

8. The phase-locked loop device as claimed in claim 7 wherein said primary inverter stage includes one or more inverters.

9. The phase-locked loop device as claimed in claim 8 further comprising a supplemental delay stage coupled between said output of said primary inverter stage and said first input of said second NAND gate.

10. The phase-locked loop device as claimed in claim 9 wherein said supplemental delay stage includes one or more inverters.

11. The phase-locked loop device as claimed in claim 10 wherein each of said inverters includes a complementary pair of MOS transistors.

12. A method for controlling in a phase-locked loop circuit the time for a VCO signal frequency to lock to a reference signal frequency, said method comprising the step of clipping the width of error-correcting pulses transmitted by a phase-frequency detector to a charge pump of said phase-locked loop circuit when a phase difference between a reference signal supplied to said phase-frequency detector and a VCO signal supplied by a voltage-controlled oscillator to said phase-frequency detector exceeds a pre-selected value.

13. The method as claimed in claim 12 wherein the step of regulating the width of the error-correcting pulses includes coupling between an input of said phase-frequency detector and an output node of said phase-frequency detector a phase-error-limiting circuit having a time delay that exceeds a corresponding time delay associated with said pre-selected value of said phase difference.

14. A device for regulating a difference signal associated with a difference between a reference signal and an output signal, said device comprising a pulse-regulating circuit having an input couplable to a signal-difference detector, said pulse-regulating circuit including means for modifying said difference signal via a means for clipping said difference signal so that said output signal may lock to said reference signal at a rate independent of the magnitude of said difference signal.

15. The device as claimed in claim 14 wherein said pulse-regulating circuit is a pulse-width-limiting circuit comprising:

a. a first input stage and a second input stage couplable to said signal-difference detector;

b. a delay stage having an input coupled to an output of said first input stage and to an output of said second input stage; and c. an output stage having an input coupled to an output of said delay stage and an output couplable to an input of an output-controlling circuit.

16. The device as claimed in claim 15 wherein said first input stage is a first inverter and said second input stage is a second inverter, wherein said first inverter and said second inverter are coupled to said input of said delay stage through an input NAND gate and wherein said delay stage includes one or more time delay components.

17. The device as claimed in claim 16 wherein said one or more time delay components of said delay stage are inverters.

18. The device as claimed in claim 17 wherein said output stage includes an output NAND gate having as a first input said output of said delay stage and as a second input an output of said input NAND gate.

19. The device as claimed in claim 18 wherein said inverters of said input stage and said inverters of said delay stage are complementary pairs of MOS transistors.

20. The device as claimed in claim 17 with said delay stage further comprising means for coupling one or more supplemental delay components to said inverters.

* * * * *